United States Patent
Schechinger

(10) Patent No.: US 7,990,227 B2
(45) Date of Patent: Aug. 2, 2011

(54) PHASED-LOCKED LOOP (PLL) SYNTHESIZER-SYNTHESIZER WITH IMPROVED VOLTAGE-CONTROLLED OSCILLATOR (VCO) PRE-TUNING

(75) Inventor: Alois Schechinger, Wolznach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 616 days.

(21) Appl. No.: 11/816,076

(22) PCT Filed: Feb. 2, 2006

(86) PCT No.: PCT/EP2006/000922
§ 371 (c)(1),
(2), (4) Date: Sep. 22, 2008

(87) PCT Pub. No.: WO2006/084627
PCT Pub. Date: Aug. 17, 2006

(65) Prior Publication Data
US 2009/0039967 A1  Feb. 12, 2009

(30) Foreign Application Priority Data
Feb. 11, 2005 (DE) .......................... 10 2005 006 345

(51) Int. Cl.
*H03B 1/00* (2006.01)
(52) U.S. Cl. .................. 331/177 V; 331/16; 331/117 R; 331/117 FE; 331/34; 331/17
(58) Field of Classification Search .............. 331/177 V, 331/36 C, 16, 34, 177 R, 17
See application file for complete search history.

(56) References Cited

U.S. PATENT DOCUMENTS

| | | | |
|---|---|---|---|
| 4,074,209 A | 2/1978 | Lysobey | |
| 4,205,272 A | 5/1980 | Kumagai | |
| 5,461,344 A | 10/1995 | Andoh | |
| 6,552,617 B1 | 4/2003 | Griffith et al. | |
| 6,784,728 B2 * | 8/2004 | Fischer | 327/554 |
| 7,019,598 B2 * | 3/2006 | Duncan et al. | 331/176 |
| 7,154,348 B2 * | 12/2006 | Lee et al. | 331/34 |
| 7,199,673 B2 * | 4/2007 | Erdogan | 331/17 |
| 7,321,271 B2 * | 1/2008 | Takinami et al. | 331/117 R |

FOREIGN PATENT DOCUMENTS

| | | |
|---|---|---|
| DE | 101 60 627 | 6/2003 |
| EP | 1 182 780 | 2/2002 |

OTHER PUBLICATIONS

PCT/EP2006/000922, International Search Report, May 15, 2006.
PCT/EP2006/000922, International Prepliminary Report on Patentability, Sep. 11, 2007.

* cited by examiner

*Primary Examiner* — Arnold Kinkead
(74) *Attorney, Agent, or Firm* — Ditthavong Mori & Steiner, P.C.

(57) ABSTRACT

An apparatus for providing Phased-Locked Loop (PLL) synthesis comprises a phase detector, at least one switchable filter, an oscillator controlled by a control voltage ($u_{PLL}$) and a divider. The controlled oscillator has two inputs, wherein the control voltage ($u_{PLL}$) is coupled to a first input, and a selection voltage ($u_{SET}$) for rough frequency adjustment is coupled to a second input. Both voltages establish the frequency of the oscillator.

10 Claims, 5 Drawing Sheets

PHASED-LOCKED LOOP (PLL) SYNTHESIZER-SYNTHESIZER WITH IMPROVED VOLTAGE-CONTROLLED OSCILLATOR (VCO) PRE-TUNING

FIELD OF THE INVENTION

The present invention, according to various embodiments, relates to a PLL (phase-locked loop) synthesizer.

BACKGROUND OF THE INVENTION

PLL (phase-locked loop) synthesizers are used in many contexts. For example, they are used in mobile-telephone technology, measurement technology and high-frequency measurement technology. PLL synthesizers are based on a reference oscillator or quartz oscillator, of which the frequency provides the basis for a specified output signal. A phase detector compares the reference frequency specified by the oscillator with the desired signal frequency and issues corresponding voltage pulses. These are then further processed in an integrator or filter circuit and supplied to a voltage-controlled oscillator (VCO). This adapts the frequency of the output oscillation according to the input specification, which, in the phase comparator or detector, is then supplied to the phase detector again via a feedback loop.

On the basis of a high-precision reference frequency, any required frequencies can be generated by means of appropriate division factors. In this context, access is made to a phase and/or frequency control, wherein a version of the required phase function scaled by the factor n is compared with the oscillation of the oscillator. The goal of the control-loop design is to provide rapid frequency-change rates, low signal noise, low component costs and short transient times.

In order to achieve rapid frequency selection in the context of DE 101 60 627 A1, an offset voltage is coupled via an additive-amplification circuit after a first filter stage. However, the disadvantage of this method is that with several selectable loop bandwidths, the cost of circuit technology is extremely high.

SUMMARY OF THE INVENTION

Accordingly, there exists a need for providing a PLL synthesizer, wherein any possible additional noise input is prevented, and at the same time, the cost of the circuit is minimized.

In accordance with one embodiment of the present invention, the features of claim 1 are provided. Further developments are specified in the dependent claims.

In accordance with one embodiment of the present invention, further filter levels are avoided, and only passive circuit elements are used. Further filter levels for noise suppression have the additional disadvantage of having a direct influence on the loop dynamics, and, in the design of PLL synthesizers, they are also contrary to the optimisation of the loop dynamics and noise suppression. In an exemplary embodiment, a frequency-selection voltage is introduced as passively as possible and ideally directly in the VCO. This allows the above-named filter levels to be avoided, and a common treatment of the main noise-influencing factors and control dynamics is possible with only one filter.

In accordance with one embodiment of the present invention realizes a circuit, which uses a VCO with only two inputs. Within the VCO, a voltage $u_{SET}$ for rough frequency selection can be connected to a connection, and a control voltage $u_{PLL}$ can be connected to a second input. The voltage $u_{SET}$ for rough frequency selection can be previously filtered in this context. A control voltage $u_{PLL}$, which is generated as previously by a phase detector by comparison of the input voltage and the frequency-divided output voltage, and of which the spectral properties are only determined through one filter, can be supplied to a second input. The associated VCO therefore has two inputs. Instead of adding the voltages $u_{SET}$ and $u_{PLL}$ to an active circuit and then filtering them again, the voltage for rough frequency selection is specified passively with this VCO realization directly in the VCO.

In this manner, it is possible to obtain a control-circuit design simplified with regard to loop dynamics and noise behavior. With previous control-circuit structures, the filter design required the provision of two filters. With the PLL synthesizer according to the invention, the design is limited to one filter. There is therefore a complete absence of active components. The filter design is conceived in order to reduce the noise input of the reference oscillator and the phase detector and at the same time to provide an appropriate control dynamic.

In accordance with one embodiment of the present invention, a noise-laden voltage for rough frequency selection $u_{SET}$ can be filtered in an extreme manner without influencing the loop dynamics as a result. The required voltage $u_{SET}$ is normally stored in a frequency-dependent manner in an electronic memory and is made available by a digital-analog converter. The switch is normally controlled in a digital manner, wherein the switching times are adapted to the desired loop bandwidth. The voltage $u_{SET}$ specified in this manner is noise-laden and must be filtered. An R-C low-pass filter circuit pre-chargeable via a switch is used as the preferred circuit. As a result of a pre-charging of the capacitor of the low-pass filter circuit, the time constant can be bridged, and the filter can be used immediately for filtering the voltage $u_{SET}$. On the one hand, the voltage is therefore immediately supplied in the full amplitude thereby providing an optimum switching voltage.

On the other hand, higher-frequency noise components, which cannot be suppressed from the phase-control circuit, are blocked by a narrow-band filter. In this manner, rapid frequency-change rates can be achieved; the design of the loop dynamic can be made completely independent of the design of the filtering; and, at the same time, an extremely narrow-band filtering of the voltage $u_{SET}$ can be achieved.

Moreover, other methods for coupling a bias voltage are possible. A charging capacitor connected in parallel in a switchable manner to the capacitor of the R-C low-pass filter, which additionally smoothes the output voltage, can also be used. In this case also, other realizations can be used, for example, a second capacitor can be provided in parallel, in a switchable manner, with a time offset, so that the charging current does not exceed a maximum amplitude.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1:
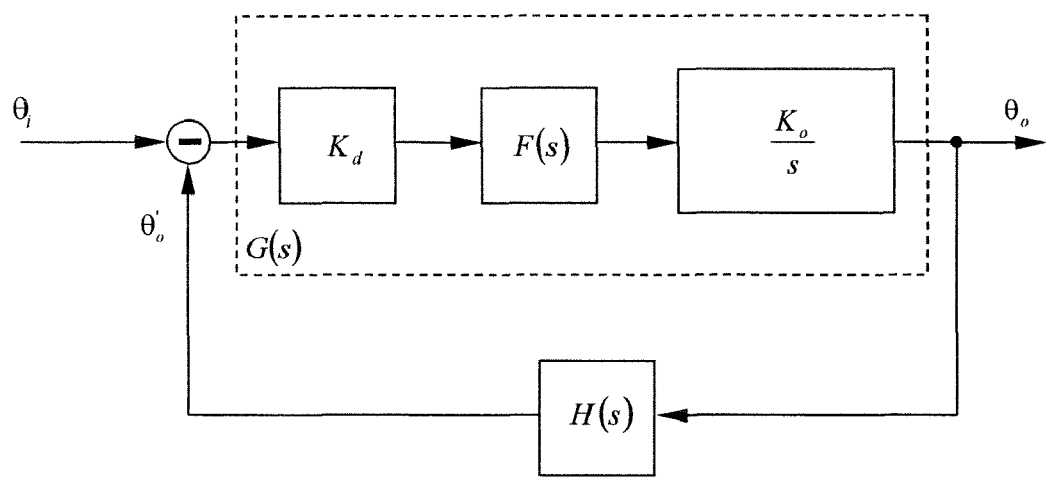
FIG. 1 shows a schematic block-circuit diagram of a PLL synthesizer, according to an exemplary embodiment.
Figure 2:
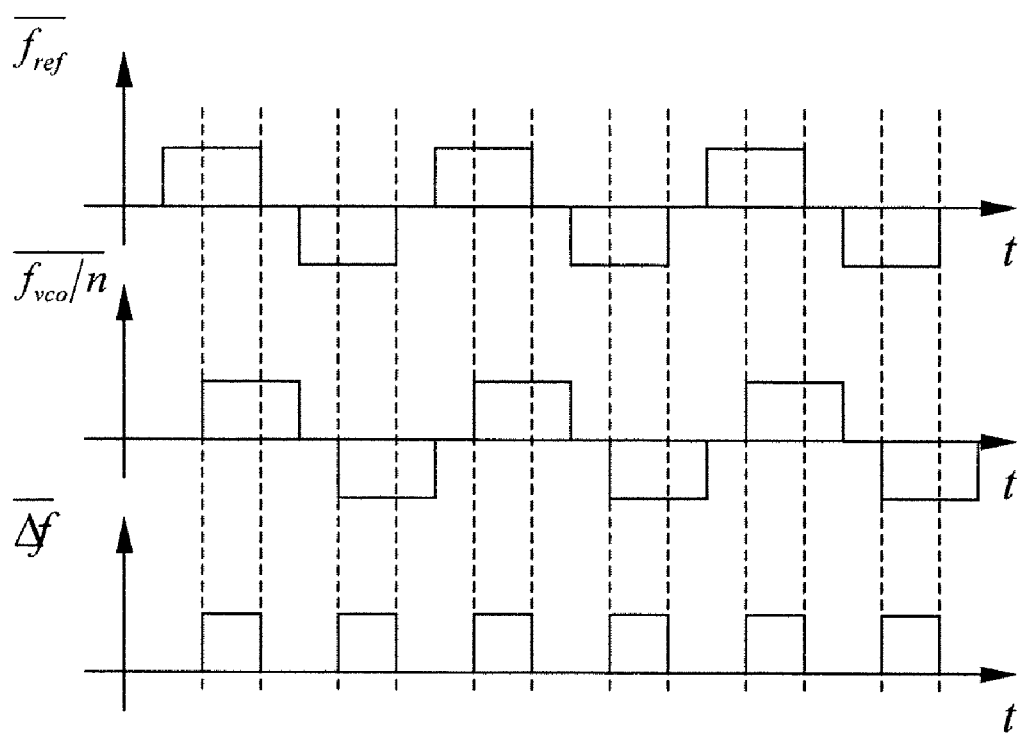
FIG. 2 shows the schematic operation of a phase detector, according to an exemplary embodiment.

Before describing the various embodiments of the present invention in greater detail, some basic principles of PLL synthesizers or respectively control circuits will first be explained below with reference to FIGS. 1 and 2 as a basis for understanding the invention. An exemplary embodiment of the circuit according to the invention is then described with reference to FIGS. 3, 4 and 5.

The principle of the phase-locked loop (referred to below as PLL) is based on a comparison of a reference signal with an actual signal or output signal. In this context, the reference signal is generated with a high-precision quartz oscillator. Using a programmable divider, it is possible to generate signals with a frequency, which can be specified within a wide framework. So-called phase detectors (referred to below as PD) or phase comparators are used for the comparison of the signals.

The method of operation of a PD will first be modelled in a linear manner. This condition is fulfilled precisely when the loop is locked. Moreover, let us assume that the output voltage of the PD is proportional to the difference of the phases of the input signals, that is:

$$u_d = K_\theta(\theta_i - \theta_o) \text{ in [V]} \quad (1)$$

wherein $\theta_i$ and $\theta_o$ represent the phases of the reference-oscillator oscillation or the output signal. $K_\theta$ in this context is the proportionality factor of the phase detector and has the unit [V/rad] for phase detectors with voltage output or respectively [A/rad] for phase detectors with current output. The VCO is also assumed to be linear. The signal frequency at its output is obtained from the voltage at the filter output $u_e$ [V] and from the gradient of the VCO characteristic $K_o$ [Hz/V]. The output frequency $\Delta\omega$ [rad/s] of the VCO can be specified as:

$$\Delta\omega = K_o u_e(t) = \dot\theta(t) \quad `\leftrightarrow` \quad `K_o U_e(s) = s \cdot \Theta_o(s)` \quad (2)$$

The VCO therefore has a low-pass filter character. A Laplace correspondence is indicated by '↔', and corresponding values in the time or respectively frequency domain are indicated by lower case or respectively upper case symbols for the corresponding characters in the formula, for example $u_e(t) \leftrightarrow U_e(s)$. The parameter s represents the frequency variable corresponding to the time variable t or respectively the dual frequency variable with unit [s⁻¹]. Accordingly, the following equation is obtained for the transmission function B(s) of the closed control circuit:

$$B(s) = \frac{\theta_o(s)}{\theta_i(s)} = \frac{K_\theta K_o F(s)/s}{1 + K_\theta K_o F(s)/s} \quad (3)$$

wherein F(s) is the transmission function of a possible low-pass filter. In the simplest configuration, no low-pass filter is used, and B(s) is simplified to give:

$$B(s) = \frac{\theta_o(s)}{\theta_i(s)} = \frac{K_\theta \cdot K_o}{s + K_\theta \cdot K_o} = \frac{1}{1 + (s/W)} \quad (4)$$

which represents a low-pass filter characteristic with amplification 1 and bandwidth $W = K_\theta \cdot K_o$.

By contrast with the above model, a PD is based on the principle of converting input signals (generally sinusoidal oscillations) into rectangular signals by thresholding. A phase delay is then presented as a time delay of the edges of the rectangle. The difference between these mutually-displaced rectangular input signals gives a rectangular difference signal, which specifies the control voltage $u_{PLL}$ as an adjustment value when converted into charge in the form of a pulse. The low-pass filter behavior for the VCO obtained in equation (2) integrates the voltage or charge pulses and gives the controlled phase $\theta_o$ of the output signal with the amplification factor $K_o$. Within the VCO, the integration can be regarded as a derivation of a staircase function from the voltage pulses. FIG. 1 additionally visualizes the difference formation of the input signals in the PD.

A VCO includes an L-C oscillation circuit, in which, for example, in the given invention, capacitors are controlled in a voltage-based, adjustable manner. These controllable capacitors can be realised with variable-capacitance diodes or varactor diodes. Accordingly, the following applies for the known formula for the resonance frequency $f_R$ of the oscillation circuit:

$$f_R = \frac{1}{2\pi \cdot \sqrt{L \cdot C(u_s)}} \text{ in [Hz]} \quad (5)$$

wherein C(.) is the characteristic of the voltage-controlled capacitor and $u_s$ is the voltage for controlling the operating point. Accordingly, the following equation is initially obtained for the output frequency of the VCO:

$$\Delta\omega_R = 2\pi f_R \quad (6)$$
$$= \frac{1}{\sqrt{L \cdot C(u_s)}}$$
$$= \frac{1}{\sqrt{L \cdot C(u_s + \delta u)}}$$
$$\approx K_o \delta u \text{ in [rad/s]}$$

With an appropriate linearization of (6) on the basis of the component characteristic C(.) about an operating point $C(u_s)$, the VCO behavior can be modelled in a linear manner.

Figure 3:
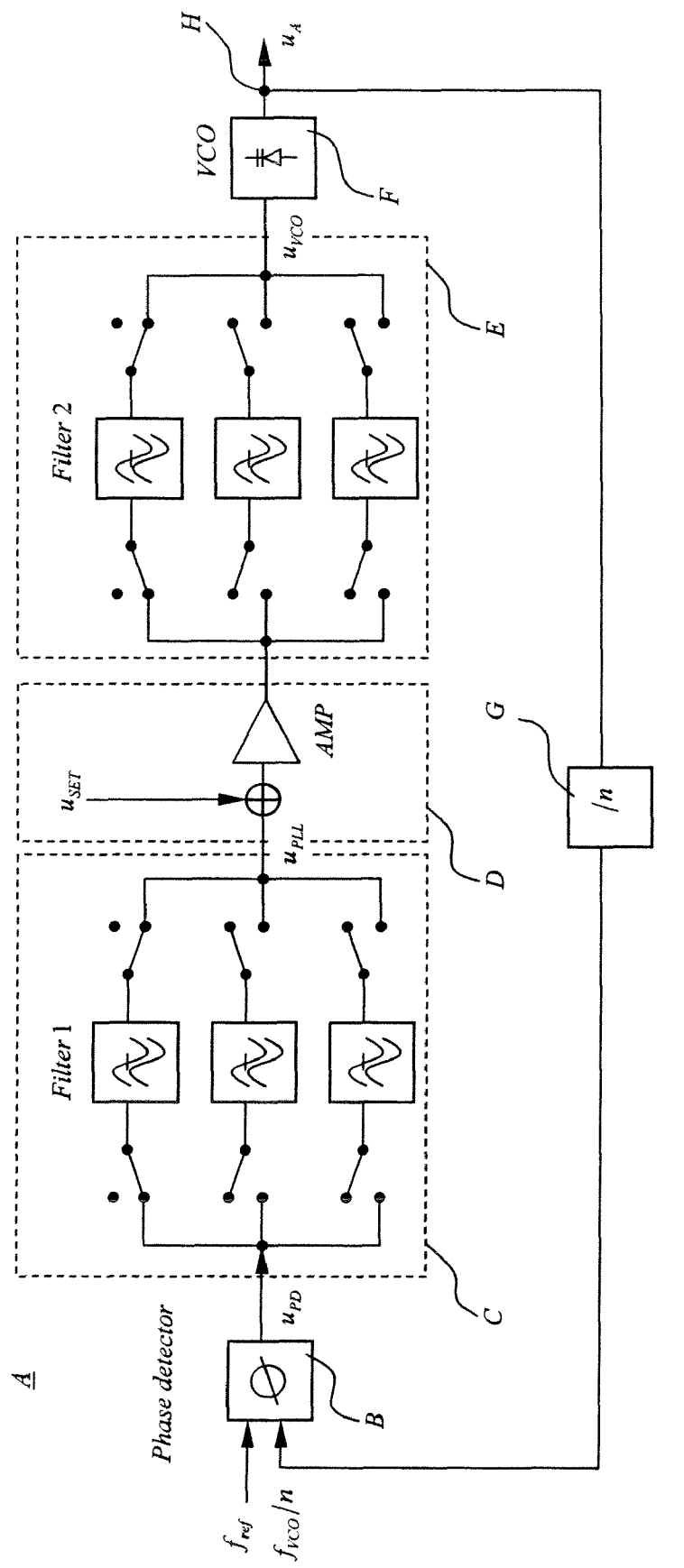
FIG. 3 shows a block circuit diagram of a conventional PLL synthesizer with pre-tuning and selectable bandwidths conventional approach.

The next section of this description describes the conventional approach conventional approach. As shown in FIG. 3, a PLL synthesizer A includes a PD (phase detector) B, to the inputs of which a reference frequency $f_{ref} = 1/(2\pi)\dot\theta_{ref}$, for example, that of a reference oscillator, which is not shown, and the frequency $f_{VCO}/n = 1/(2\pi)\dot\theta_{VCO}/n$, fed back via a programmable divider G via a feedback loop and divided down by the factor n, are connected. A first switchable filter C is provided at the output of the phase detector (PD) B. In the drawing, three possibilities are shown for the filter for broadband selection. Via an adding circuit D, a voltage for the rough frequency selection $u_{SET}$ is added to the control voltage $u_{PLL}$. The overall voltage is then filtered with a second filter E and supplied to the voltage-controlled oscillator F. As already indicated the output oscillation or respectively the output signal is then fed back via a divider G to the phase detector B. The output signal can be picked up at the output H.

The control voltage $u_{PLL}$ is connected at the output of the first filter C. At that position, an offset or switching voltage $u_{SET}$ is added to the control voltage $u_{PLL}$, so that a voltage $u_{PLL}+u_{SET}$ is obtained at the amplifier AMP. This resulting voltage is then amplified and filtered by means of a switchable filter E, in order to reduce the noise, which is superimposed over the voltage $u_{PLL}+u_{SET}$. The source of the noise is both from the voltage $u_{SET}$ and also in the amplifier AMP, which acts as an adding unit.

The transmission function of the phase detector PD is assumed to be two-dimensional and time-variant within the model. The transmission behavior of the PD can be modelled as linear at a certain point and for a certain duration, because, as can be seen in FIG. 2, the object can ultimately be understood as a modification of two sinusoidal input voltages by appropriate thresholding, which can be presented as a linear operation by multiplication with an appropriate function, in order to obtain by subtraction an appropriate output voltage, which communicates appropriate pulses to the integrator circuit $F_1(s)$, which converts the voltage pulses into mutually-displaced jump functions.

In the realization according to the invention with an improved voltage-controlled oscillator (VCO), the voltage $u_{SET}$ for rough frequency selection and the control voltage $u_{PLL}$ are supplied directly to the VCO because of the advantages in circuit and control-technology. In this context, the object of the voltage $u_{SET}$ is the rough frequency selection, that is to say, the rough pre-tuning to a required target frequency, and the object of control voltage $u_{PLL}$ is to balance the remaining phase and/or frequency differences.

Figure 4:
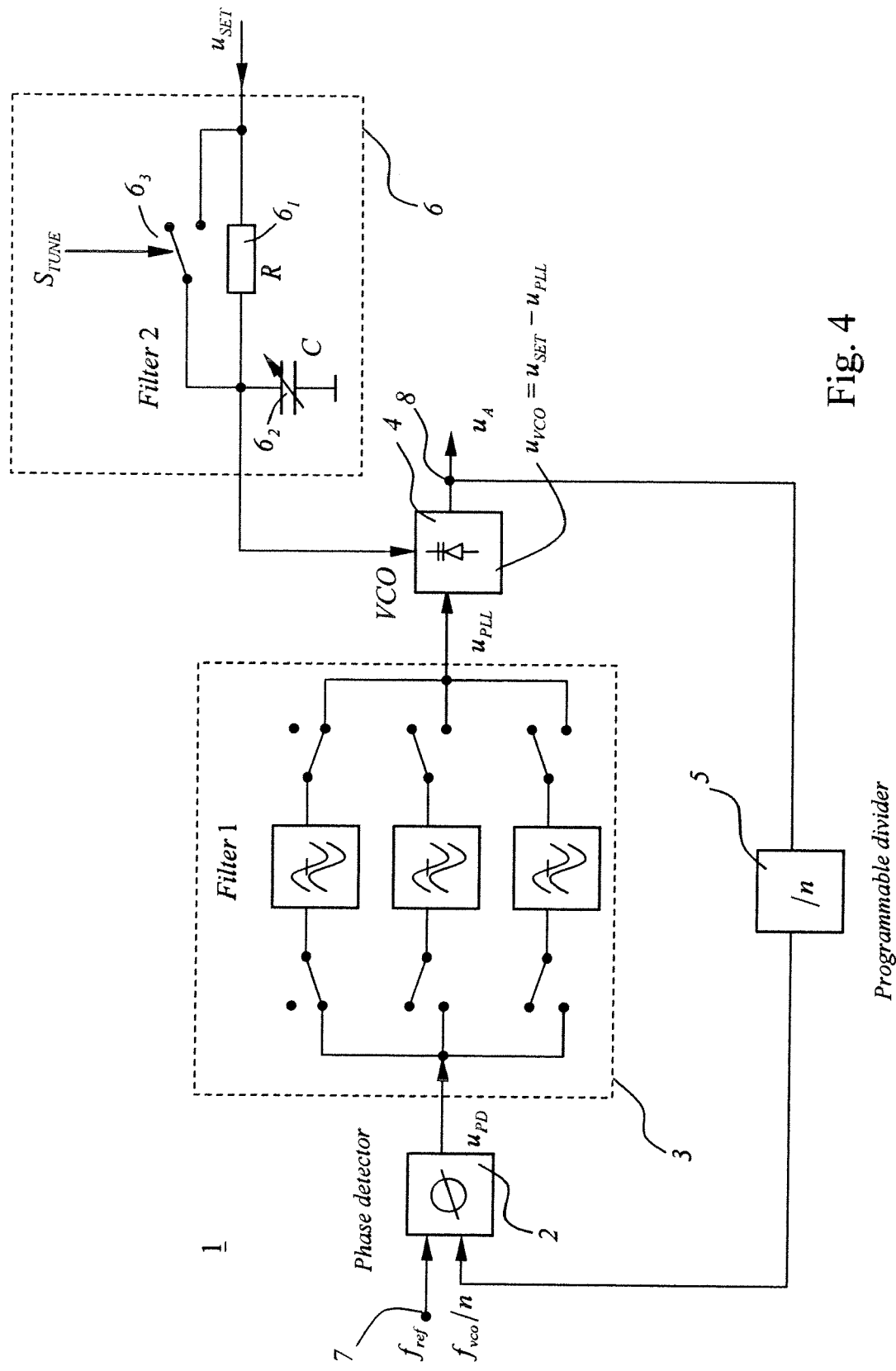
FIG. 4 shows an exemplary embodiment of a PLL synthesizer, according to an exemplary embodiment.

The PLL synthesizer according to the invention, of which the exemplary embodiment is shown in FIG. 4, includes, as in the case of the conventional approach, a phase detector 2, a first filter 3 and a controlled oscillator (VCO) 4, wherein a control voltage $u_{PLL}$ is supplied to a first input, and a second voltage $u_{SET}$ for frequency selection is supplied to a second input of the oscillator 4. The filtering of the voltage $u_{SET}$ for rough frequency selection takes place by means of a filter 6, which is realized by an R-C low-pass filter, consisting of a resistor $6_1$ and a capacitor $6_2$. A switching element $6_3$, which bridges the resistor $6_1$, allows a rapid pre-charging of the capacitor $6_2$. The capacitor $6_2$ can advantageously be adjustable or can consist of two individual capacitors, wherein one of these individual capacitors can be added to the system by switching.

By contrast with the conventional approach, the voltage $u_{SET}$ for rough frequency selection is not supplied within the control circuit, but is supplied to the controlled oscillator (VCO) 4 at a second input. Accordingly, a second filter is not required, because the voltage $u_{SET}$ for rough frequency selection, which originates from a digital/analog converter (not shown) and is filtered outside the control circuit with the low-pass filter 6, is supplied directly to the oscillator (VCO) 4 at its second input. The inherent time constant of the filter 6 can be bridged by using the switching element $6_3$ and therefore allows faster frequency-change rates by comparison with the conventional approach.

Figure 5:
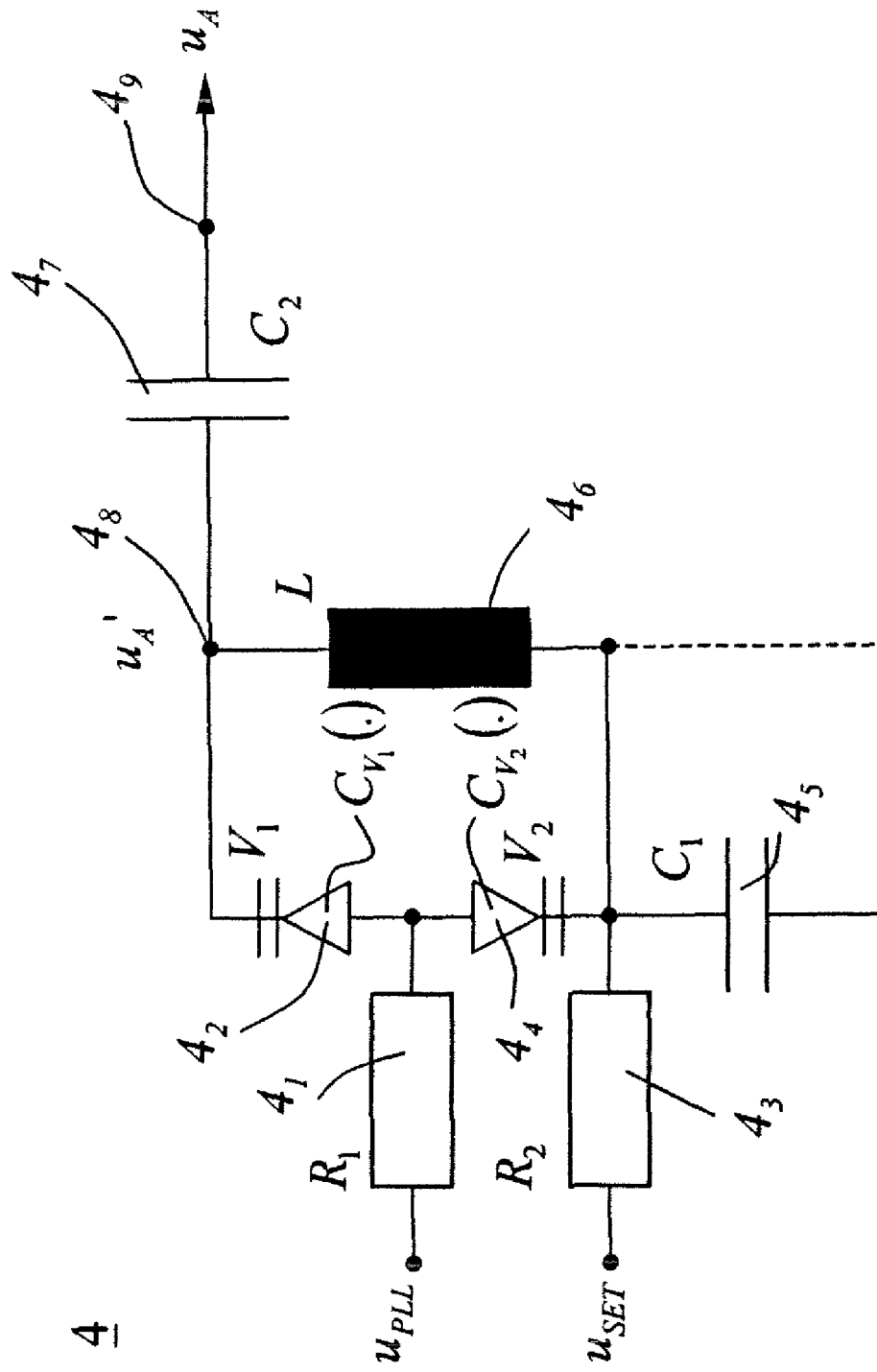
FIG. 5 shows an exemplary embodiment of a VCO circuit, according to an exemplary embodiment.

FIG. 5 shows an exemplary embodiment of the resonator of a voltage-controlled oscillator. FIG. 5 shows only a part of a VCO, namely the resonator. A complete VCO is provided only if an active component (transistor) is added. The oscillator 4 includes two adjustable capacitors $4_2$ and $4_4$, preferably diodes, especially varactor and/or variable-capacitance diodes, which form an oscillation circuit with a fixed inductance $4_6$; an output capacitor $4_7$, which forms a short-circuit for high-frequency voltages and currents and blocks any constant and/or low-frequency current and/or voltage components; and a capacitor $4_5$, which forms a short-circuit to earth for high-frequency signals.

In particular, a first resistor $4_1$ is connected by a second connection to a first connection of a first adjustable capacitor, especially a variable-capacitance diode and/or varactor diode $4_2$, and a second resistor $4_3$ is connected by a first connection to a second adjustable capacitor, in particular a variable-capacitance diode and/or varactor diode $4_4$. The second diode $4_4$ in this context is connected by a second connection to a second connection of the resistor $4_1$ and to a first connection of the first diode $4_2$. The second resistor $4_3$ is connected via the capacitor $4_5$ to earth. A first connection of the inductance $4_6$ is connected to a second connection of the second resistor $4_3$, to a first connection of the capacitor $4_5$, to a first connection of the second diode $4_4$ and to a second connection of the first diode $4_2$.

The inductance forms a parallel circuit with the diodes $4_2$ and $4_4$. The throughput direction of the second diode $4_4$ extends in this context from a second connection of the first resistor $4_1$ to a second connection of the second resistor $4_3$. The throughput direction of the first diode $4_2$ extends from a second connection of the resistor $4_1$ to a second connection of the inductance $4_6$. The inductance $4_6$ and the first diode $4_2$ are connected in each case to a second connection at the point $4_8$ via a capacitor $4_7$ to the output $4_9$ of the resonator. A first connection of the inductance $4_6$, which is connected to a second connection of a second resistor $4_3$ and to a first connection of the second diode $4_4$, can also be connected directly to earth.

The main elements of the oscillation circuit are formed from the voltage-controlled diodes $4_2$ and $4_4$ and the inductance $4_6$, wherein the voltages $u_{PLL}$ and respectively $u_{SET}$ are coupled via a first connection of the resistors $4_1$ and respectively $4_3$. The capacitor $4_5$ in this context forms a direct-voltage separation to earth and a through connection for high-frequency oscillations. By contrast, the output capacitor $4_7$ additionally decouples direct voltage and low-frequency oscillation or signal components towards the output $4_9$ from the output voltage $u_4$.

The voltages $u_{PLL}$ and $u_{SET}$ adjust the variable-capacitance diodes $4_2$ and $4_4$ to an operating point dependent upon specifications from the phase detector and the frequency selection. In this context, the voltage difference $\Delta u_1 = u_{PLL} - u_4'$ determines a first capacitance on the basis of the characteristic $C_{v_1}(\Delta u_1)$ of the first diode $4_2$, and the voltage difference $\Delta u_2 = u_{PLL} - u_{SET}$ determines a second capacitance on the basis of the characteristic $C_{v_2}(\Delta u_2)$ of the second diode $4_4$. The first voltage difference in this context is identical to the second voltage difference, because the inductance $4_6$ for constant voltage $u_{SET}$ represents a through connection, that is to say $u_4' = u_{SET}$ and accordingly $\Delta u_2 = \Delta u_1$. With this VCO circuit, a direct earth can also be provided, instead of the capacitor $4_5$.

The total capacitance $[C_{ges}]$ of the varactor diodes $4_2$ and $4_4$ in this context can be calculated after pre-tuning of the voltage using the following formula:

$$C_{ges}(\Delta u_1, \Delta u_2) = \frac{C_{v_1}(\Delta u_1) C_{v_2}(\Delta u_2)}{C_{v_1}(\Delta u_1) + C_{v_2}(\Delta u_2)} \quad (7)$$

wherein $\Delta u_1 = u_{PLL} - u_A'$ represents the voltage drop across the first diode $4_2$ and $\Delta u_2 = u_{PLL} - u_{SET}$ represents the voltage drop across the second diode $4_4$. In equation (7), $C_{v_1}(\Delta u_1)$ represents a characteristic of the first diode $4_2$, and $C_{v_2}(\Delta u_2)$ represents a characteristic of the second diode $4_4$. The voltages $u_{SET}$, $u_{PLL}$ and $u_A'$ in this context are voltages for rough frequency selection ($u_{SET}$) and for fine tuning ($u_{PLL}$) and/or balancing of the operating point and a voltage ($u_A'$) at the point $4_8$ of the VCO circuit.

The following section of the description describes further advantages of the embodiment according to the invention shown in FIG. 4.

The use of a charge pump (not shown), means that active filters can be completely dispensed with in the realization according to the invention. Noise inputs therefore only occur as a result of noise components or interference-frequency components in the oscillator reference signal and passive components.

The filter 3 is designed as a stepped low-pass filter. A low-pass-filter behavior is achieved in cooperation with the properties of the remaining loop elements. Appropriate component values for an R-C circuit can be determined using an automated design method.

The control voltage $u_{PLL}$ may have a variance range, for example, of $\pm 1.5$ V, as a result of which, the form of the output oscillation changes to a minimal extent in accordance with the component characteristics.

The present realization uses voltage-controlled oscillator circuits and varactor diodes. However, other known alternative oscillator circuits and frequency-determining elements can also be used.

The invention claimed is:

1. An apparatus for providing Phased-Locked Loop (PLL) synthesis, comprising: Ea phase detector, at least one switchable filter, an oscillator controlled by a control voltage ($u_{PLL}$) and a divider,
wherein
the controlled oscillator comprises first and second voltage-controlled diodes, one inductance and two fixed-specification capacitors and has two inputs, wherein the control voltage ($u_{PLL}$) is coupled to a first input, and a selection voltage ($u_{SET}$) for rough frequency adjustment is smoothed with an R-C low-pass filter and coupled to a second input, wherein both voltages establish the frequency of the oscillator,
a first resistor is connected to the first diode, a second resistor is connected to the second diode, and the inductance forms a parallel circuit with the diodes, and
a capacitor, including two condensers, of the low-pass filter is adjustable and connects a resistor and a connection of a switching element to earth, wherein the switching element bridges the resistor in order to pre-charge the capacitor.

2. An apparatus according to claim 1,
wherein
one of the two condensers is designed to be switchable into the system.

3. An apparatus according to claim 1,
wherein
the first and second voltage-controlled diodes are varactor diodes.

4. An apparatus according to claim 1,
wherein
the throughput direction of the second diode extends from a second connection of the first resistor to a second connection of the second resistor, and the throughput direction of the first diode extends from a second connection of the first resistor to a second connection of the inductance.

5. An apparatus according to claim 1,
wherein
the inductance and the first diode are each connected via a fixed-specification capacitor to the output of the oscillator.

6. An apparatus according to claim 1,
wherein
the second resistor is connected to earth via a fixed-specification capacitor.

7. An apparatus according to claim 1,
wherein
a first connection of the inductance, which is connected to a second connection of the second resistor and to a first connection of the second diode, is connected directly to earth.

8. An apparatus according to claim 3,
wherein
an overall capacitance $[C_{ges}]$ of the varactor diodes is obtained from the following formula:

$$C_{ges}(\Delta u_1, \Delta u_2) = \frac{C_{v_1}(\Delta u_1) \cdot C_{v_2}(\Delta u_2)}{C_{v_1}(\Delta u_1) + C_{v_2}(\Delta u_2)}$$

wherein $\Delta u_1 = u_{PLL} - u_A'$ denotes the voltage drop across the first varactor diode ($4_2$), $\Delta u_2 = u_{PLL} - u_{SET}$ denotes the voltage drop across the second varactor diode, $C_{v_1}(.)$ denotes a characteristic of a first varactor diode, $C_{v_2}(.)$ denotes a characteristic of a second varactor diode, $u_{SET}$ denotes the selection voltage, $u_{PLL}$ denotes the control voltage and $u_A'$ denotes a voltage at the point of the oscillator.

9. An apparatus for providing Phased-Locked Loop (PLL) synthesis, comprising: a phase detector, at least one switchable filter, an oscillator controlled by a control voltage ($u_{PLL}$) and a divider,
wherein
the controlled oscillator comprises first and second voltage-controlled diodes, one inductance and two fixed-specification capacitors and has two inputs, wherein the control voltage ($u_{PLL}$) is coupled to a first input, and a selection voltage ($u_{SET}$) for rough frequency adjustment is coupled to a second input, wherein both voltages establish the frequency of the oscillator, and
a first resistor is connected to the first diode, a second resistor, connected to earth via a fixed-specification capacitor, is connected to the second diode, and the inductance forms a parallel circuit with the diodes.

10. An apparatus for providing Phased-Locked Loop (PLL) synthesis, comprising: a phase detector, at least one switchable filter, an oscillator controlled by a control voltage ($u_{PLL}$) and a divider,
wherein
the controlled oscillator comprises first and second voltage-controlled diodes, one inductance and two fixed-specification capacitors and has two inputs, wherein the control voltage ($u_{PLL}$) is coupled to a first input, and a selection voltage ($u_{SET}$) for rough frequency adjustment is coupled to a second input, wherein both voltages establish the frequency of the oscillator,
a first resistor is connected to the first diode, a second resistor is connected to the second diode, and the inductance forms a parallel circuit with the diodes, and
a first connection of the inductance, which is connected to a second connection of the second resistor and to a first connection of the second diode, is connected directly to earth.

* * * * *